US006918819B2

(12) United States Patent
Buehler

(10) Patent No.: US 6,918,819 B2
(45) Date of Patent: Jul. 19, 2005

(54) METHOD FOR DEFECT REDUCTION

(75) Inventor: Mark F. Buehler, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 10/429,989

(22) Filed: May 6, 2003

(65) Prior Publication Data
US 2003/0194949 A1 Oct. 16, 2003

Related U.S. Application Data

(62) Division of application No. 09/476,977, filed on Dec. 31, 1999, now Pat. No. 6,592,433.

(51) Int. Cl.[7] ................................................ B24B 1/00
(52) U.S. Cl. .............................. 451/36; 451/41; 451/54
(58) Field of Search ..................... 134/1.3, 6; 438/692, 438/693, 687, 627; 451/36, 41, 42, 54, 63

(56) References Cited

U.S. PATENT DOCUMENTS

| 3,879,216 | A | * | 4/1975 | Austin | .......................... 134/26 |
|---|---|---|---|---|---|
| 4,541,945 | A | * | 9/1985 | Anderson et al. | .............. 134/41 |
| 4,755,230 | A | * | 7/1988 | Ashton et al. | ............ 134/22.14 |
| 5,633,068 | A | * | 5/1997 | Ryoke et al. | ................ 428/143 |
| 5,639,722 | A | * | 6/1997 | Kong et al. | .................... 134/42 |
| 5,709,588 | A | * | 1/1998 | Muroyama | .................... 451/41 |
| 5,817,569 | A | * | 10/1998 | Brenner et al. | .............. 438/460 |
| 5,896,875 | A | * | 4/1999 | Yoneda | .................... 134/100.1 |
| 5,972,124 | A | * | 10/1999 | Sethuraman et al. | ........... 134/7 |
| 5,989,353 | A | * | 11/1999 | Skee et al. | ...................... 134/2 |
| 6,022,400 | A | * | 2/2000 | Izumi et al. | .................... 106/3 |
| 6,169,034 | B1 | * | 1/2001 | Avanzino et al. | ........... 438/693 |
| 6,178,585 | B1 | * | 1/2001 | Cadien et al. | .................. 15/230 |
| 6,190,237 | B1 | * | 2/2001 | Huynh et al. | .................. 451/41 |
| 6,217,416 | B1 | * | 4/2001 | Kaufman et al. | .............. 451/41 |

* cited by examiner

Primary Examiner—Timothy V. Eley
(74) Attorney, Agent, or Firm—Blakely, Sokoloff, Taylor & Zafman LLP

(57) ABSTRACT

A method of removing at least one particle from a substrate is disclosed comprising polishing a metallized layer over the substrate using a slurry to remove a portion of the metallized layer and polishing the substrate using the slurry to remove a portion of a barrier between the metallized layer and the substrate. The method further includes introducing deionized water onto the substrate and introducing a solution comprising a weak acid selected from the group consisting of acetic acid, citric acid, gluconic acid, glucuronic acid, oxalic acid, and tartaric acid.

4 Claims, 14 Drawing Sheets

DEFECT DENSITY REDUCTION COMPARISON BETWEEN A CONVENTIONAL CLEANING PROCESS AND THE NEW BUFFERED CITRIC ACID CLEAN

DEFECT EVENTS (MEASURED BY THE TENCOR AIT) COMPARISON BETWEEN A CONVENTIONAL CLEANING PROCESS AND THE NEW BUFFERED CITRIC ACID CLEAN

METHOD FOR DEFECT REDUCTION

RELATED APPLICATION

The present application is a divisional application of U.S. Ser. No. 09/476,977, filed Dec. 31, 1999, now U.S. Pat. No. 6,592,433.

BACKGROUND OF THE INVENTION

1. Field of the Invention

The invention relates generally to removal of particles from a substrate and more particularly to removal of at least one particle from a metal layer deposited on a substrate using an acid.

2. Description of Related Art

Integrated circuits are made up of literally millions of active devices formed in or on a silicon substrate or well. The active devices that are initially isolated from one another are later connected together to form functional circuits and components. The devices are interconnected together through the use of well known multilevel interconnections. A cross-sectional illustration of a typical multilevel interconnection structure 10 is shown in FIG. 1. Interconnection structures normally have a first layer of metallization, an interconnection layer 12 (typically aluminum alloys with up to 3% copper), a second level of metallization 14, and sometimes a third or even fourth level of metallization. Interlevel dielectrics 16 (ILDs), such as doped and undoped silicon dioxide ($SiO_2$), are used to electrically isolate the different levels of metallization in silicon substrate or well 18. The electrical connections between different interconnection levels are made through the use of metallized vias 11 formed in ILD 16. In a similar manner, metal contacts 22 are used to form electrical connections between interconnection levels and devices formed in well 18. The metal vias 11 and contacts 22, hereinafter being collectively referred to as "vias" or "plugs", are generally filled with tungsten 14 and generally employ an adhesion layer 16 such as TiN. Adhesion layer 16 acts as an adhesion layer for the tungsten metal layer 14 which is known to adhere poorly to $SiO_2$. At the contact level, the adhesion layer acts as a diffusion barrier to prevent W and Si from reacting.

In one process, metallized vias or contacts are formed by a blanket tungsten deposition and a chemical mechanical polish (CMP) process. In a typical process, via holes 23 are etched through an ILD 24 to interconnection lines or a semiconductor substrate 26 formed below. Next, a thin adhesion layer 28, such as TiN, is generally formed over ILD 24 and into via hole 23, as shown in FIG. 2B. Next, a conformal tungsten film 29 is blanket deposited over the adhesion layer and into the via hole 23. The deposition is continued until the via hole 23 is completely filled with tungsten. Next, the metal films formed on the top surface of ILD 24 are removed by CMP, thereby forming metal vias or plugs 28.

In a typical CMP process as shown in FIG. 2C, the substrate or wafer 30 is placed face-down on a polishing pad 32 which is fixedly attached to a rotatable platen 34. In this way, the thin film of a metal layer to be polished (i.e., tungsten film 29) is placed in direct contact with pad 32. A carrier 36 is used to apply a downward pressure $F_1$ against the backside of substrate 30. During the polishing process, pad 32 and platen 34 are rotated while a downward force is placed on substrate 30 by carrier 36. An abrasive and chemically reactive solution, commonly referred to as "slurry" 35 is introduced onto pad 32 during polishing. Slurries generally include an abrasive material such as alumina or silica. The slurry initiates the polishing process by chemically reacting with the film being polished. The polishing process is facilitated by the rotational movement of pad 32 relative to wafer 30 as slurry is provided to the wafer/pad interface. Polishing is continued in this manner until all of the film on the insulator is removed.

After the polishing process, the substrate is then rinsed with a solution such as deionized water. By rinsing the substrate, particles from the slurry are removed from the metallized layer.

Conventional rinsing methods include using a double sided scrubber using deionized water for removing particles present from the CMP from a metallized layer. However, using deionized water generally does not remove all of the particles. Another conventional method is a "magasonic" bath which involves high frequency vibration in which particles are shaken off the substrate. This method also leaves particles on the metal layer.

Removing foreign particles from a substrate that is used in integrated circuits is known in the art. One known method involves introducing a slurry over a substrate and polishing the substrate. The substrate is then rinsed with deionized water. A scrubber then cleans the substrate. However, this method is problematic because it is unable to remove the particles to a nondetectable level. FIG. 8 shows that a substrate using a conventional method such as that which is described above leaves a large quantity of defects on the substrate. Particles on a substrate may affect the electrical conductivity between the various layers of the interconnect within an integrated circuit and cause catastrophic failures upon further processing. Accordingly, it is desirable to have a method and an apparatus wherein particles are removed from a substrate to a nondetectable level of particles without affecting adhesion or the integrity of the post-polish metal layer surface.

SUMMARY OF THE INVENTION

A metal layer is cleaned by introducing an acid onto the metal layer.

DETAILED DESCRIPTION OF THE INVENTION

A method and a composition is disclosed for reducing defects in an electronic device such as in an integrated circuit by using a buffered solution comprising an acid. The following detailed description and the accompanying drawings are provided for the purpose of describing and illustrating presently preferred embodiments of the invention only, and are not intended to limit the scope of the invention.

One embodiment of the invention relates to a method of removing at least one particle by polishing a metal layer over a substrate using a slurry and introducing a solution that includes an acid. Another embodiment of the invention relates to the same process described above except the solution comprises an acid and a chelating agent. The solution may also be buffered.

Another embodiment of the invention relates to a method of using a first solution that is deposited onto the substrate and a polisher that has an abrasive material at the surface of a polishing pad of the polisher that contacts the substrate and removing the particle from the substrate using a second solution containing an acid.

In another embodiment of the invention, a chelating agent is used in the solution. In yet another embodiment of the invention, the solution is buffered to allow the pH to remain constant.

Figure 1:
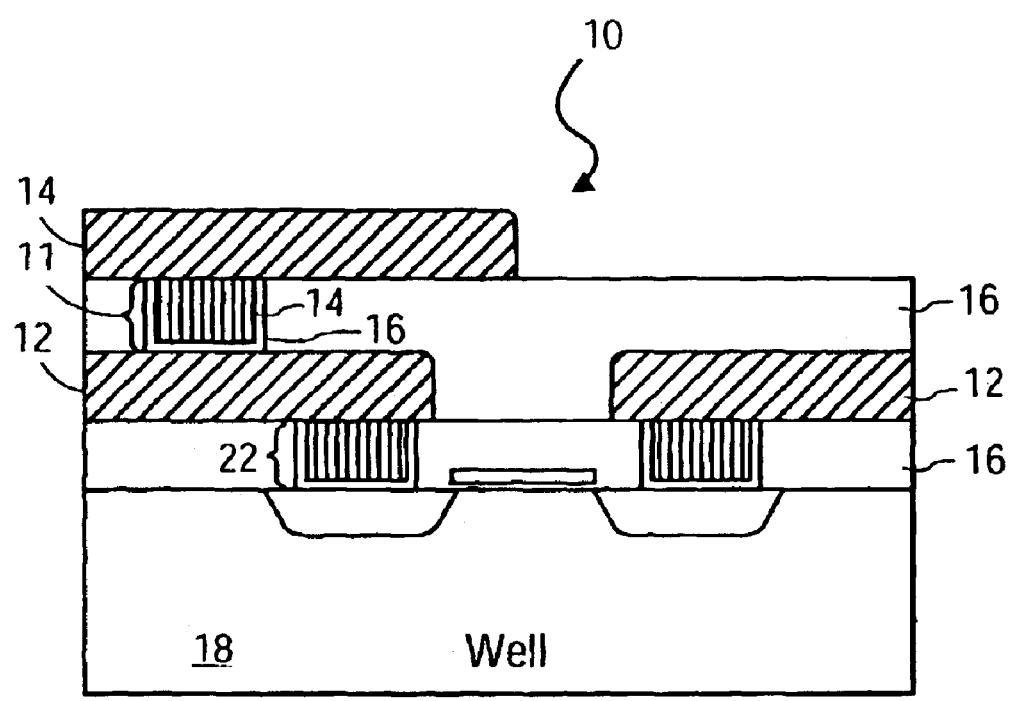
FIG. 1 is a cross-sectional illustration showing a portion of a standard multilevel integrated circuit.
Figure 2A:
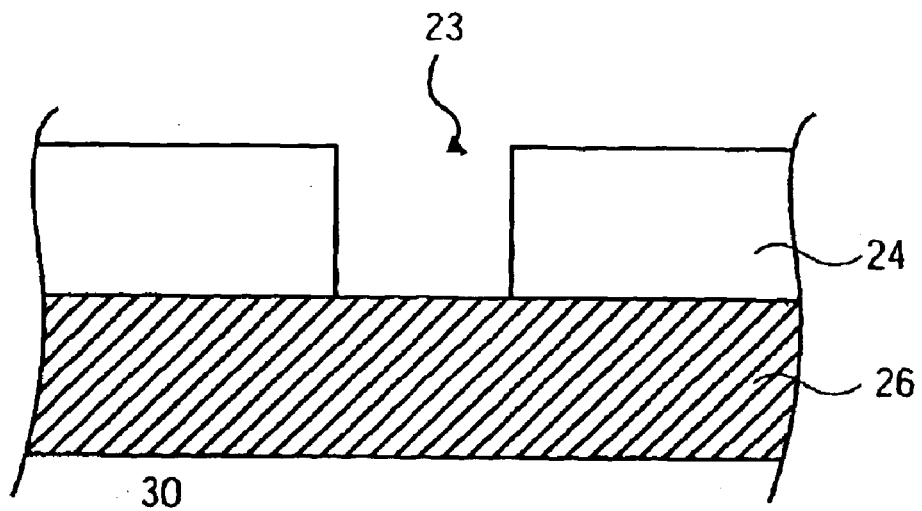
FIG. 2A is a cross-sectional illustration showing the formation of a via hole through an insulating layer formed on a conductive layer of a semiconductor substrate.
Figure 2B:
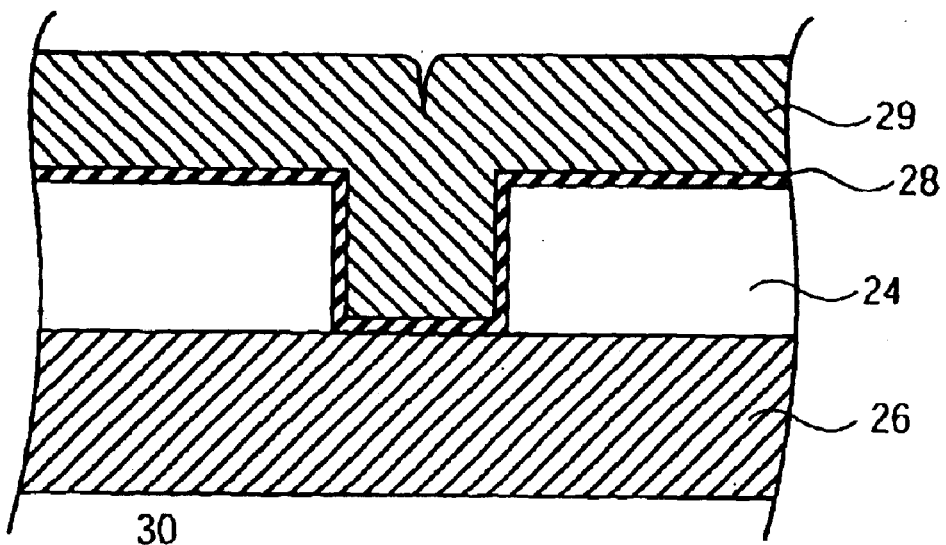
FIG. 2B is a cross-sectional illustration showing the formation of an adhesion layer and a tungsten layer on the substrate of FIG. 2A.
Figure 2C:
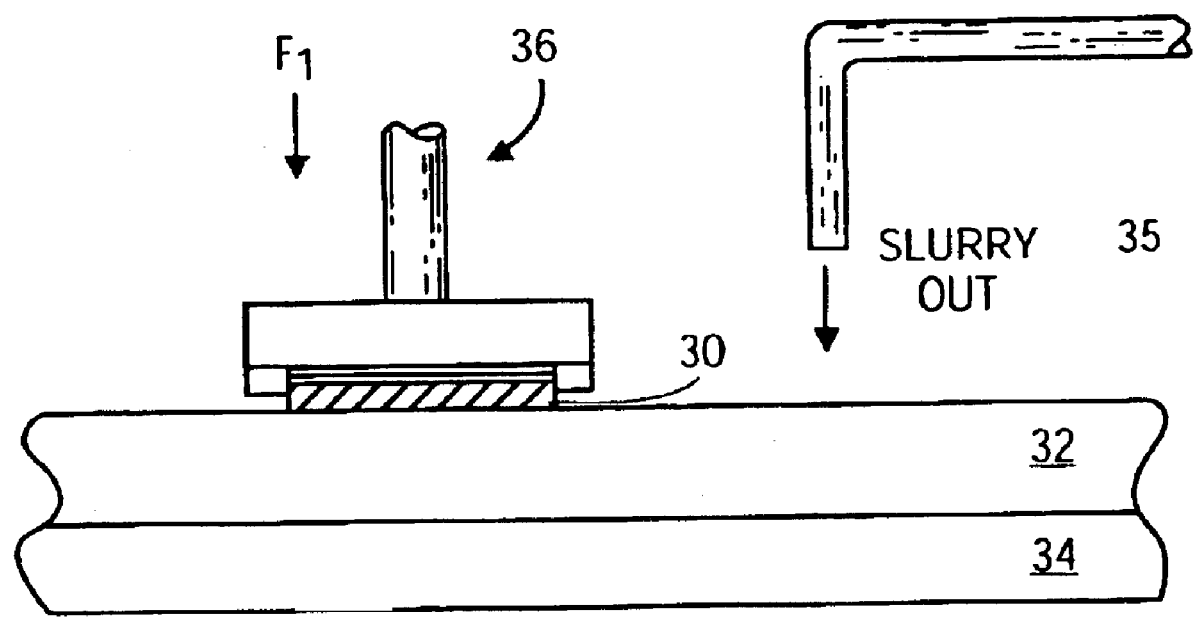
FIG. 2C is a cross-sectional illustration of a chemical mechanical polishing apparatus used to polish the films formed on the substrate of FIG. 2B.
Figure 3:
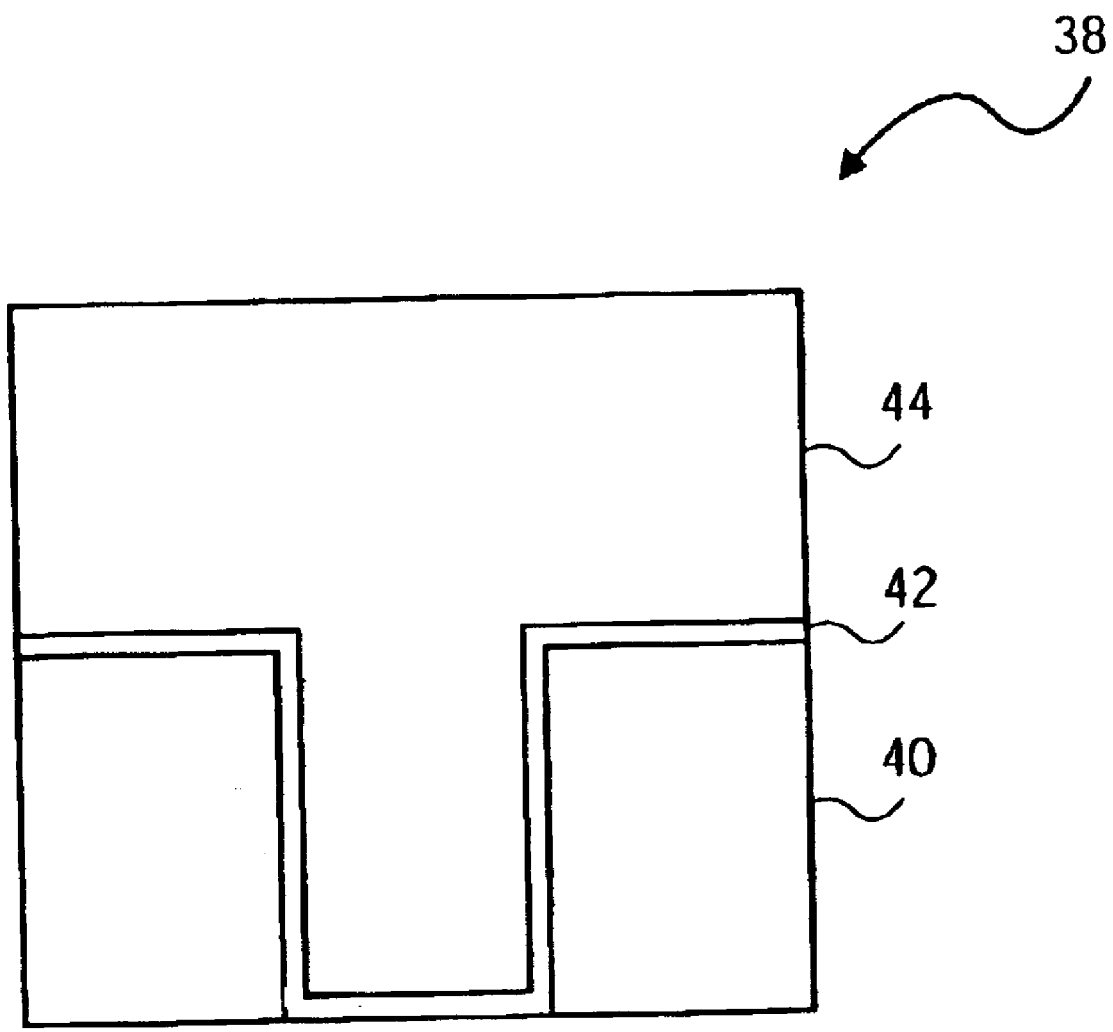
FIG. 3 illustrates an assembly wherein a barrier layer is formed over an oxide layer of a substrate.
Figure 4:
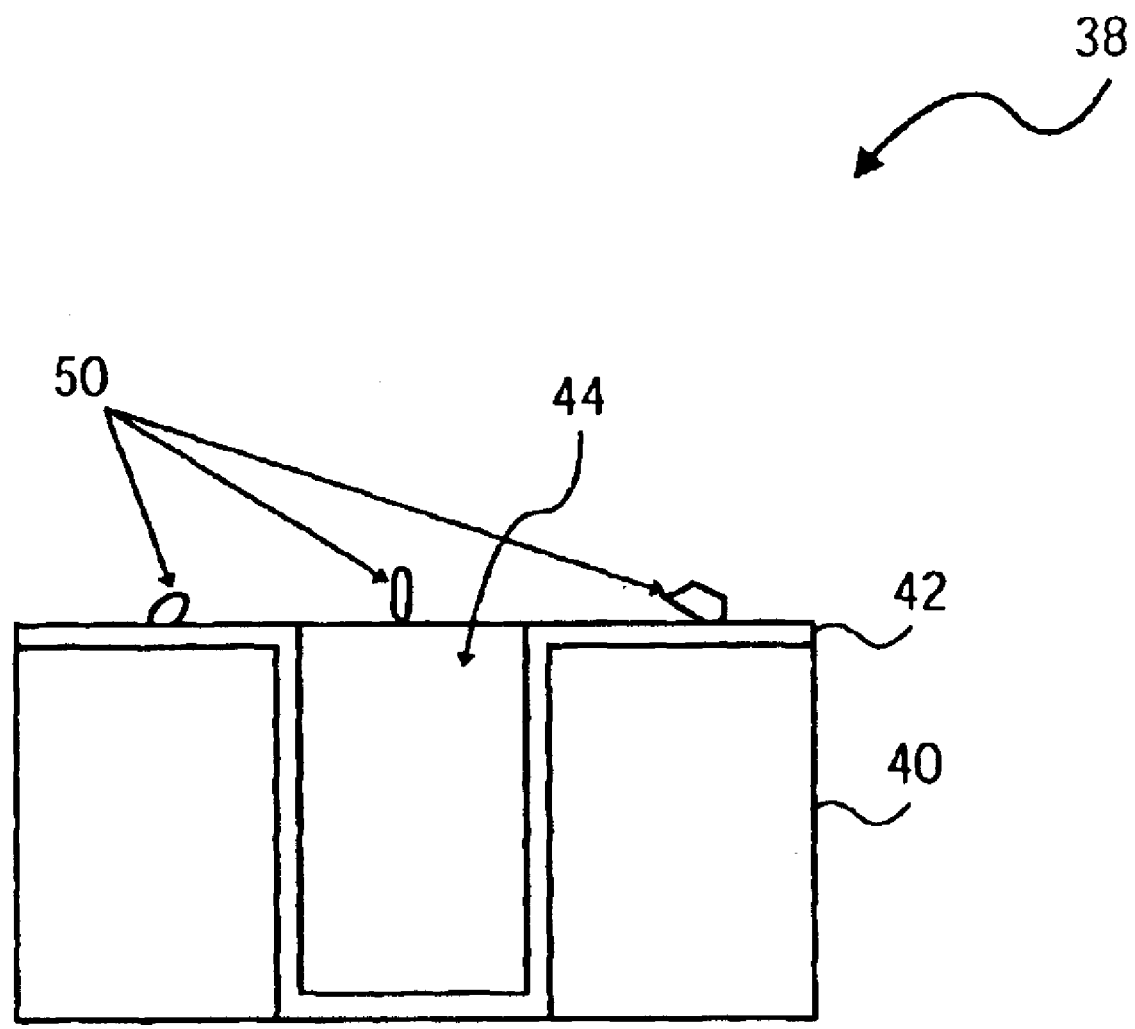
FIG. 4 illustrates the assembly of FIG. 3 after the assembly has undergone a first polishing operation.

FIGS. 3 through 7 show one embodiment of a fabrication process (e.g., an integrated circuit fabrication process) incorporating the method of the invention wherein a solution containing an acid is used to remove particles from the surface of a substrate. FIG. 3 shows wafer 38 wherein oxide layer 40 is disposed over a substrate. Adhesion layer 42 comprising of, for example, tantalum is formed over oxide layer 40. Metal layer 44 comprising an adhesion material such as copper, or any other suitable conductive material is blanket deposited over adhesion layer 42 and has formed a via or contact. Preferably, copper is used. FIG. 4 shows the substrate of FIG. 3 after the metal layer has been polished using a conventional polishing technique. One conventional polishing technique for polishing a metal layer of copper involves introducing a slurry (also referred to herein as a first agent) of alumina or silica onto a polishing pad and the polishing pad then contacts the metal layer. As illustrated in FIG. 4, fabrication techniques such as chemical mechanical polishing ("CMP") generate undesired particles on the surface of the substrate. Particles 50 that may have been generated from the first polishing operation or from some other source remain on barrier layer 42 and metal layer 44. Such particles can disrupt the integrity of electrical signals utilizing the via and metal layer.

Figure 5:
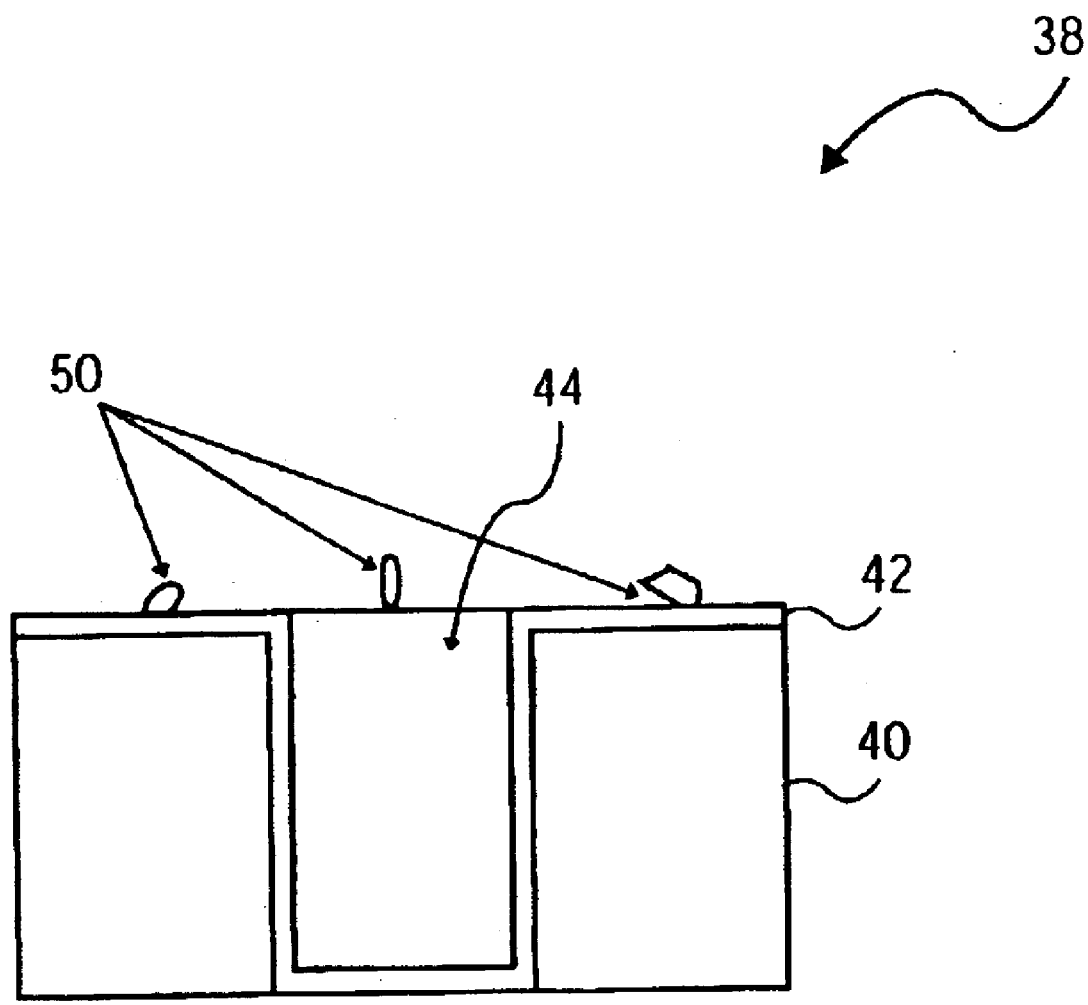
FIG. 5 illustrates the assembly of FIG. 4 after the assembly has undergone a second polishing operation.

FIG. 5 shows wafer 38 after a second polishing operation is performed in which barrier layer 42 is polished such that barrier layer 42 has been substantially removed from the surface of oxide layer 46. CMP with an abrasive material such as silica is used to perform the second polishing operation. The rate of removal of barrier layer 42 is approximately in the range of 100 Å/minute to 1000 Å/minute. Even after polishing barrier layer 42, particles 50 remain on the surface of oxide layer 46 and the metal layer 44.

Figure 6:
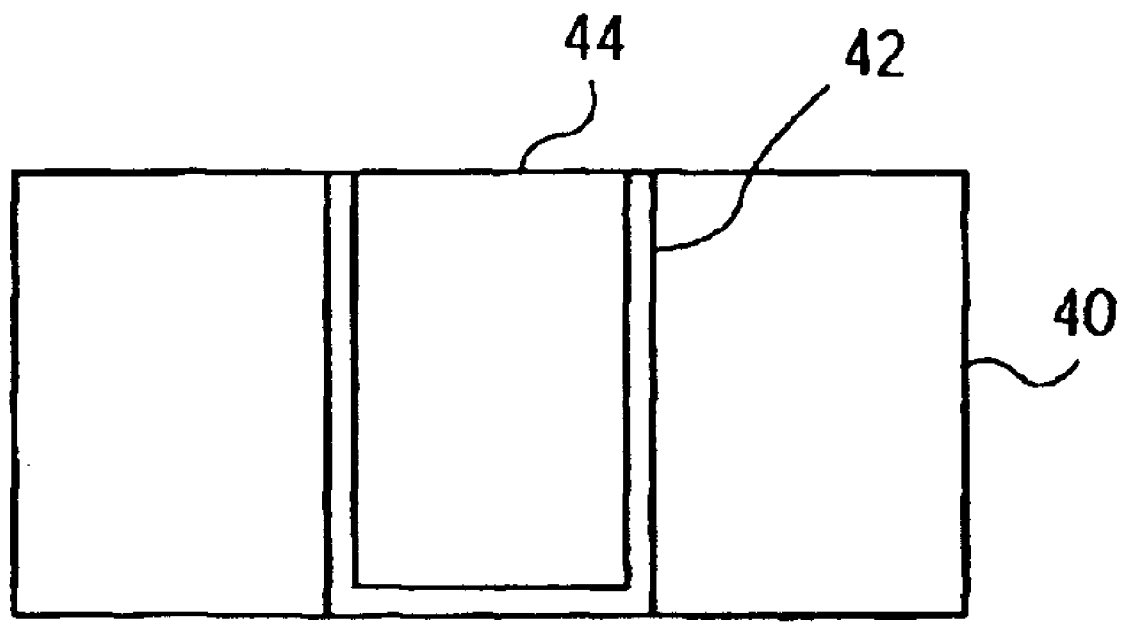
FIG. 6 illustrates the assembly of FIG. 5 after it has been rinsed.

In order to remove undesired particles 50 after both polishing steps discussed above, an aspect of the invention includes introducing a solution (also referred to herein as a second agent) comprising an acid over the substrate. FIG. 6 shows that particles 50 from the device shown in FIG. 5 have been removed from oxide layer 46 and metal layer 44 when a solution comprising an acid is used to rinse the device of FIG. 5. Preferably organic acids are used such as carboxylic acids including acetic acid, citric acid, gluconic acid, glucoronic acid, oxalic acid, and tartaric acid. It is to be appreciated that the list of suitable organic acids is not exhaustive and that other organic acids may be used particularly those having such as multivalent carboxylic acids similar to those listed. The concentration of acid to be used depends upon the acid selected. Preferably, citric acid is used at a concentration of 50 mM.

Inorganic acids may also be used such as sulfuric acid, nitric acid, and phosphoric acid. However, these inorganic acids generally must be substantially diluted to reduce their corrosivity to prevent the surface of the metal layer from becoming too rough. A sulfuric acid having a concentration on the order of less than five percent acid is an example of such a dilution. A rougher metal layer surface may affect adhesion of subsequent layers and the electrical conduction of the fabricated device.

In one embodiment of the invention, the solution comprising the acid is buffered and comprises an organic acid and a chelating agent. Examples of chelating agents include aliphatic amines, hydroxy alkyl amines, aminocarboxylic acids, cyanides, organosulphides, ammonia ethylyenediaminetetraacetic acid (EDTA), ethlyenediamine (EN), nitrilotriacetic acid (NTA), glycin, diethlyene triamine, and triethanol amine. It is generally believed that chelating agents form bonds with metals atoms of the metal layer. It will be appreciated that other chelating agents may be used provided that the chelating agent is capable of forming a bond with a metal that is used in the metal layer. In the case of a copper metal layer, a chelating agent is added to bind free (dissolved) copper ions in solution and to prevent the copper ions from adsorbing on the surface of the substrate. The composition of this solution substantially reduces particles on the surface of a substrate.

In one embodiment, the solution comprises, for example, 50 mM citric acid and 20 mM potassium citrate (or ammonium citrate as an alternative to potassium citrate), and 100 ppm of EDTA. The solution is diluted with deionized water. Suitable pH ranges are from 3 to 4 but the pH may range from 3 to 5. The pH range from 3 to 4 increases the copper solubility and the copper adsorption of ions on $SiO_2$ is minimized. This solution provides approximately in the range of two to one hundred times improvement in frontside defects. This solution also reduces backside metal levels such as copper to less than $10^{-12}$ atoms/cm$^2$ thereby eliminating the need to have a dedicated copper processing equipment. It should be noted that although one embodiment of the invention describes a metallized layer being polished prior to the rinsing solution being introduced onto the metallized layer, the metallized layer may be cleaned by introducing the rinsing solution onto the metallized layer without first polishing the metallized layer.

Table 1 compares the effectiveness of embodiments of the invention when a chelating agent is used and is not used in the process. As shown in Table 1, total reflection x-ray fluorescence ("TXRF") is one method used for determining small amounts of copper that are readsorbed onto a substrate. When citric acid scrub is used without a chelating agent, the average TXRF is $4 \times 10^{10}$ to atoms/cm$^2$. In comparison, when a chelating agent is combined with citric acid, the TXRF is nondetectable at a detection limit of $10^{10}$ atoms/cm$^2$. Conventional methods (i.e., a process using a double sided scrubber and deionized water) and control with no polish provide $9 \times 10^{10}$ atoms/cm$^2$ and $289 \times 10^{10}$ atoms/cm$^2$, respectively.

TABLE 1

Comparison of Copper Levels on the Backside of a Substrate Having Copper Contamination

| Process Used to Clean a Substrate | Coordinate | TXRF $\times 10^{10}$ atoms/cm$^2$ | Average of TXRF Data |
|---|---|---|---|
| Citric Acid Scrub | (0, 0) | nd | |
| | (0, 40) | nd | |
| | (63.6, 63.6) | 4.4 | |
| | (−63.6, −63.6) | nd | 4 |
| Citric Acid Scrub Wherein the Citric Acid is Combined With EDTA | (0, 0) | nd | |
| | (0, 40) | nd | |
| | (63.6, 63.6) | nd | |
| | (−63.6, −63.6) | nd | nd |
| Conventional Method Using Deionized Water | (0, 0) | nd | |
| | (0, 40) | nd | |
| | (63.6, 63.6) | 5.6 | |
| | (−63.6, −63.6) | 13 | 9 |
| Control Process Wherein No Polish Is Used (Post-electroplate) | (0, 0) | 52 | |
| | (0, 40) | 75 | |
| | (63.6, 63.6) | 313 | |
| | (−63.6, −63.6) | 716 | 289 |

Figure 7:
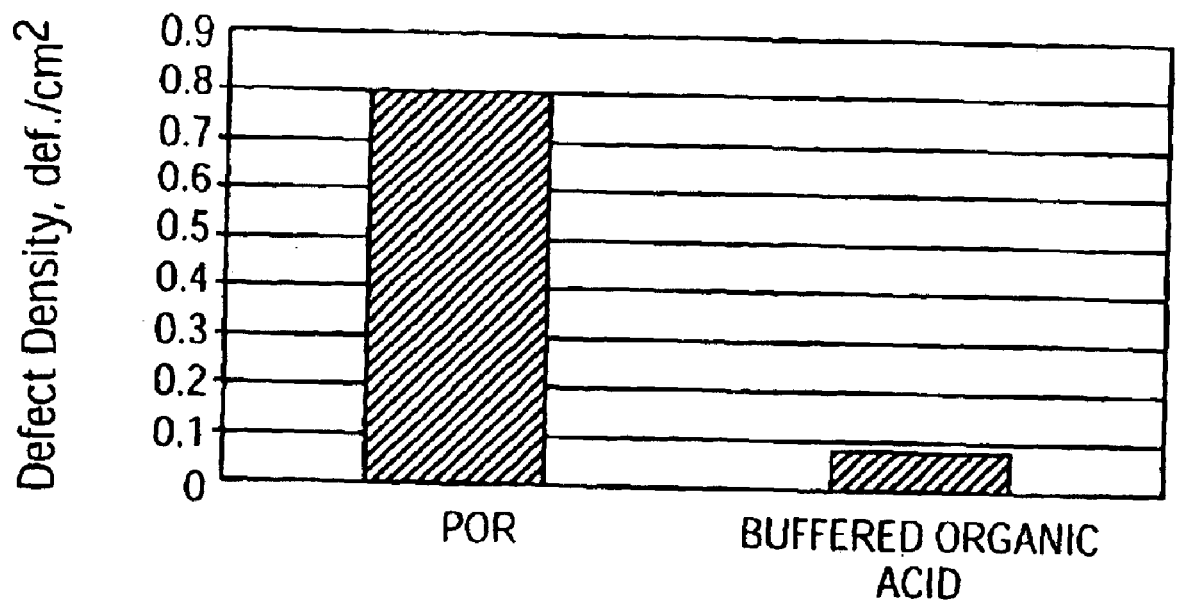
FIG. 7 provides a graphic comparison of defect density on a wafer using a conventional method compared to one embodiment of the invention.
Figure 8:
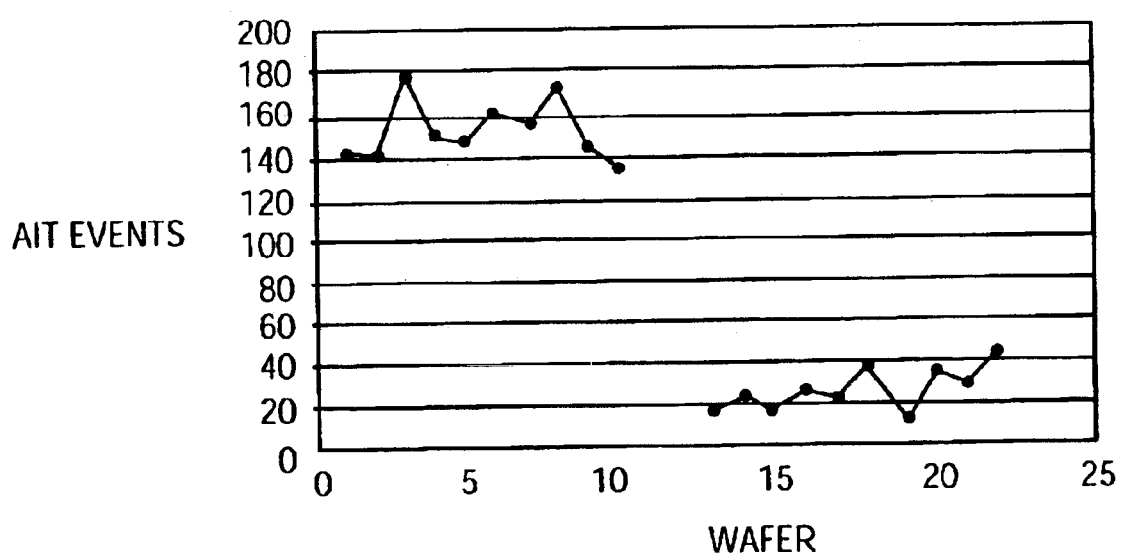
FIG. 8 provides a graphic comparison of defect events on a wafer using a conventional method compared to one embodiment of the invention.

FIGS. 7 and 8 compare the amount of defects between the conventional process of using deionized water compared to a buffered citric acid solution. For example, FIG. 7 shows that POR leaves 0.8 defects/cm$^2$ compared to approximately 0.06 defects/cm$^2$ of the buffered organic acid. FIG. 8 further shows the defects between a POR clean which is generally greater than 140 defects on a wafer compared to the much lower defects of about 40 defects or lower for a buffered citric acid process.

Figure 9:
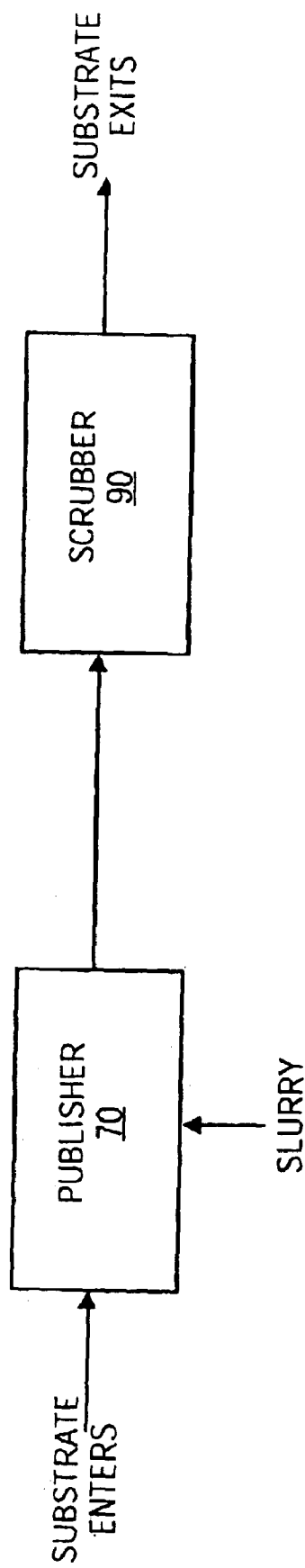
FIG. 9 illustrates a schematic view of the process that may be used in accordance with an embodiment of the invention.

FIG. 9 shows one embodiment of the invention wherein a substrate is advanced to a polishing operation 70 in which a slurry is put onto the polishing pad and the polishing pad contacts the substrate and is used during the polishing operation. Chemical mechanical polishing (CMP) may be used in this process. However, it will be appreciated that other suitable methods such as orbital polishing may be used to practice the invention. In CMP, a portion of a metal layer comprising a metal such as copper may be removed from the substrate using a slurry that is dispensed or deposited onto the metal layer. The slurry includes an abrasive material such as aluminum, silica, or other suitable material.

Figure 10:
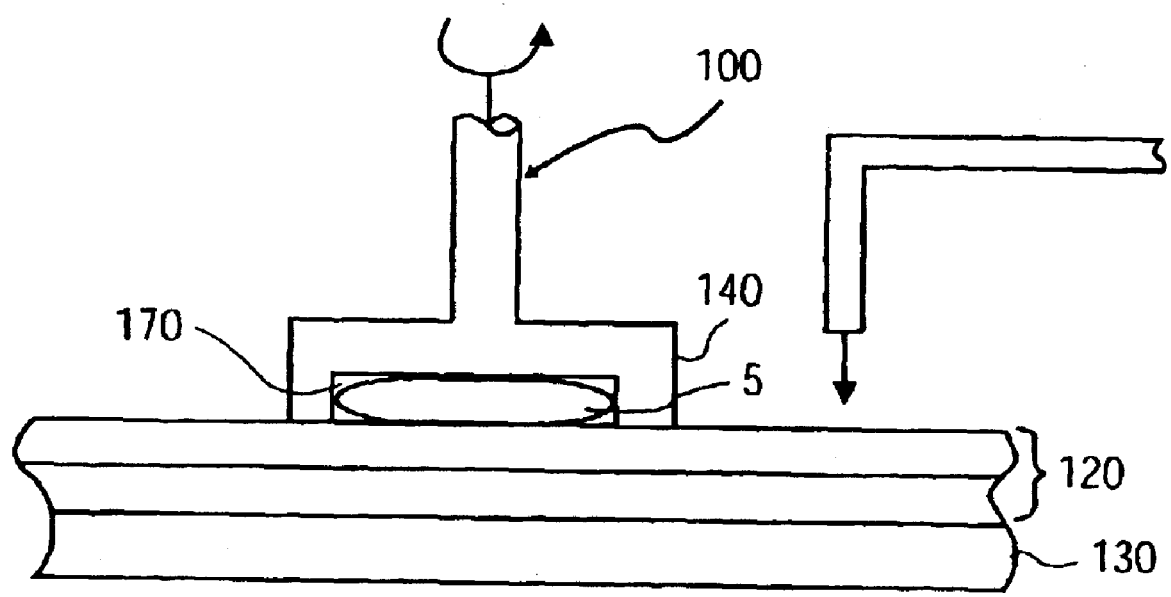
FIG. 10 illustrates a polisher that may be used in one embodiment of the invention.

A polisher 100 shown in FIG. 10 generally comprises a carrier 140 and three platens (130, second and third platens are not shown). Each platen has a polish pad 120. Two of the three platens may be used to remove a portion of the copper using a slurry. The slurry may contain an abrasive material such as alumina, silica, etc. Each platen further has four polishing heads 170. The polishing heads rotate on a turret.

The substrate is polished in series such that platen one 140 removes a portion of a metallized layer such as copper by polishing for a certain amount of time such as less than two minutes and the substrate is then moved to the second platen where another portion of the copper is removed using a slurry. The substrate then moves to a third platen where a portion of the tantalum is removed. At the third platen 130, the pressure is lowered to approximately 2 psi. The polish time of this operation is approximately 125 seconds or less.

The substrate is then advanced to scrubber 30 wherein a solution is introduced through the polisher and is deposited over the substrate and the substrate is scrubbed. The solution that is introduced onto the substrate contains an acid and preferably a chelating agent. The solution may also be buffered. Finally, the substrate undergoes a spin/rinse/dry cycle until it reaches a dried state. The substrate is dried for approximately 2 minutes or less at a temperature of approximately 22° C.

Figure 11:
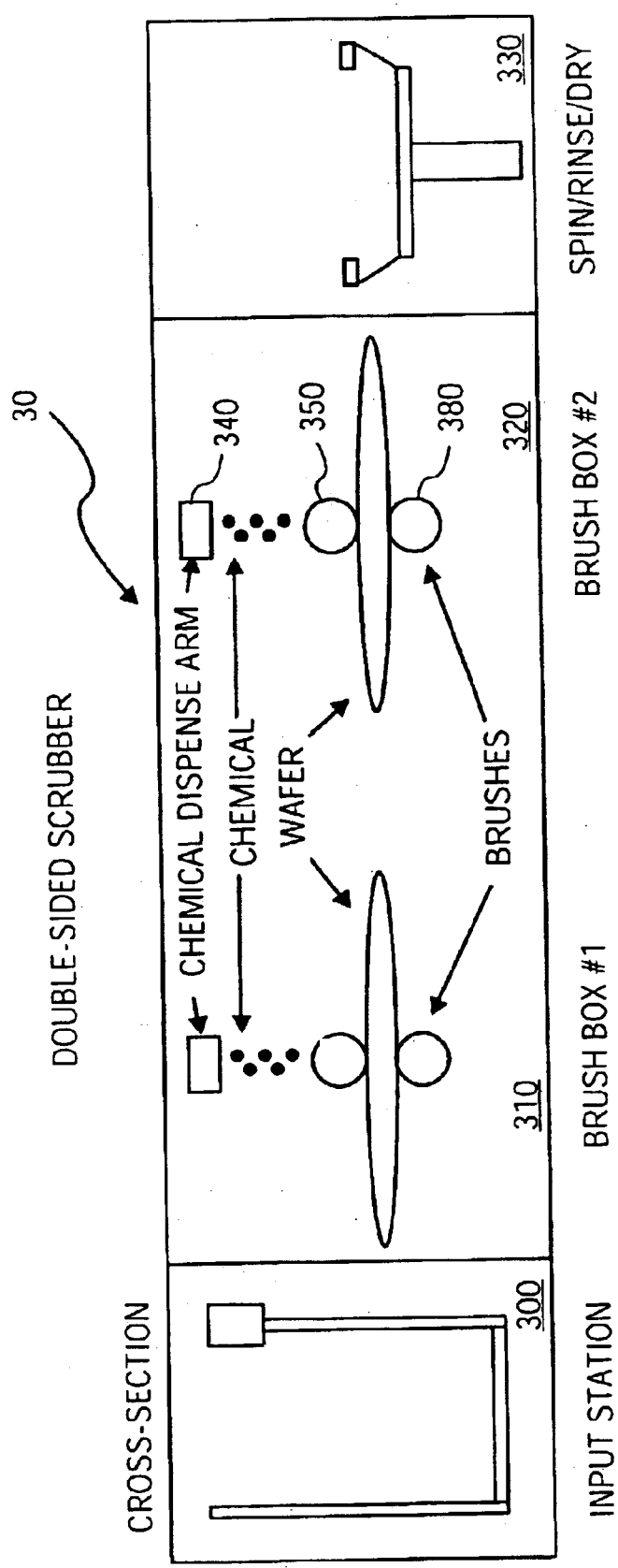
FIG. 11 illustrates a scrubber that may be used in one embodiment of the invention.

Scrubber 90 shown in FIG. 11 may be a double-sided scrubber that has four submodules (300, 310, 320, 330). In the first submodule 300, deionized water is sprayed onto the substrate. The substrate is then advanced to a second submodule 310 wherein a buffered solution comprising an acid and a chelating agent is applied to the substrate. The solution may be fed to the substrate through a chemical dispense arm 340 onto a brush 350. The substrate is then advanced to a third submodule 320 wherein the substrate enters a second brush box. In this operation, the chemical solution may be dripped onto the top box or the hardware of the scrubber 30 is used to spray the chemical solution onto the backside of the substrate to reduce the copper contamination on the back side of the substrate. The wet substrate is then advanced to the spin/rinse/dry module 330 where the wafer is wet and is rinsed with deionized water is introduced while it rotates at 2,000 rpm until the wafer is dry.

The chemical solution is added to the substrate at a rate of approximately 300 milliliters/minute. While in scrubber 90, the substrate is scrubbed with at least one or more soft poly vinyl alcohol brushes 380. The brush rotates generally at 100 revolutions per minute (rpm). Waste water exits from the scrubber at a flow rate of approximately 2 gallons per minute.

Figure 12A:
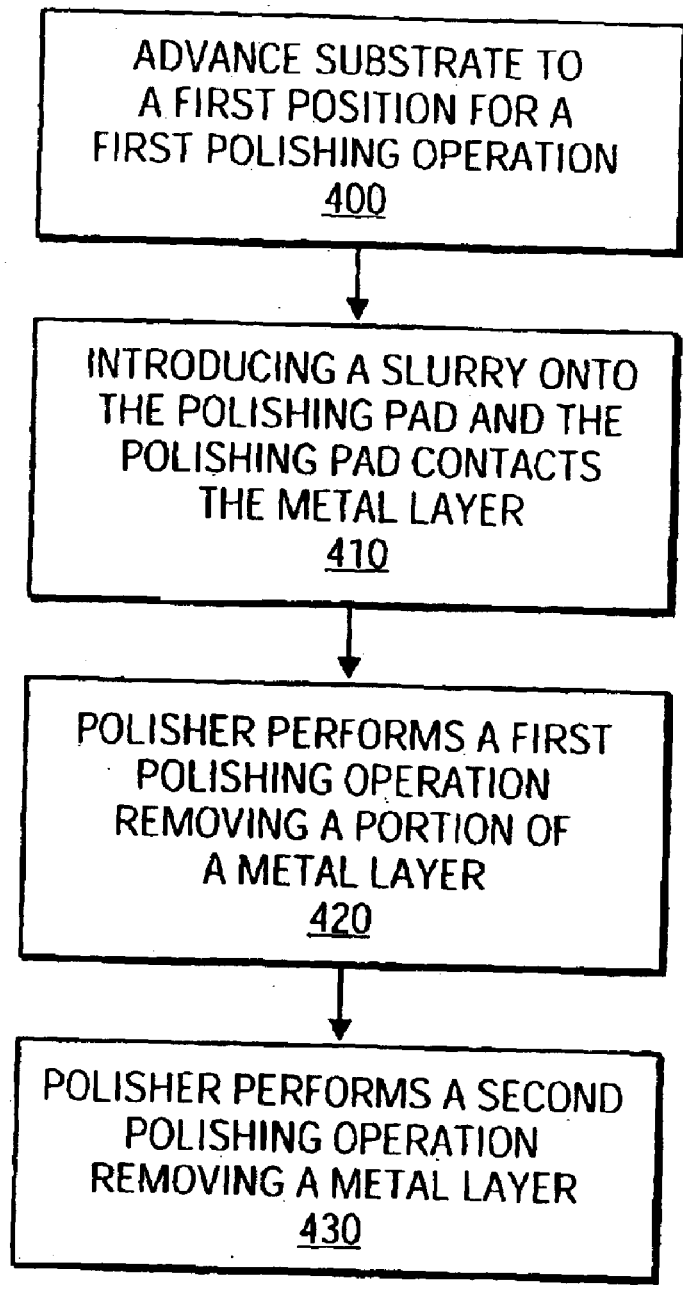
FIGS. 12A and 12B illustrate a flow diagram in accordance with an embodiment of the invention.
Figure 12B:
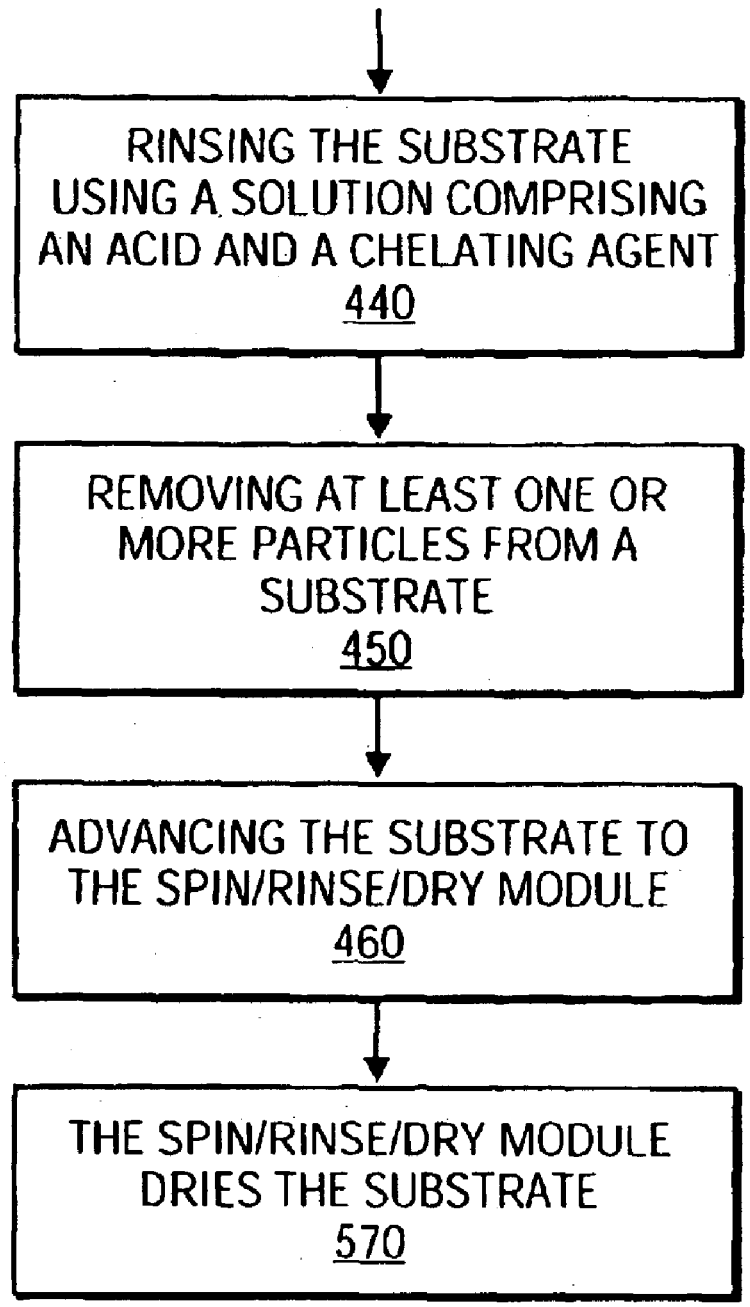

FIGS. 12A and 12B are a flow chart of one embodiment of the invention used to remove at least one or more particles from a substrate. At operation 400, the substrate is advanced to a position such that the substrate is adjacent to a polisher. The polisher performs a first polishing operation wherein a portion of the metal layer such as copper is removed. At operation 410, a slurry is introduced over a substrate. The slurry includes an abrasive material such as silica or alumina. At operation 420, the polisher uses the slurry to perform a first polish of the surface of the substrate in order to remove a portion of a metallized layer comprising a metal such as copper on the substrate. At operation 430, the surface of the substrate is polished in a second polishing operation using a polisher to remove a portion of the metal layer comprising a metal such as tantalum. At operation 440, the substrate is rinsed with a solution comprising an acid and preferably a chelating agent. A weak organic acid is preferable such as acetic acid, citric acid, gluconic acid, glucoronic acid, oxalic acid, and tartaric acid. At least one particle is removed from the surface of a substrate using a scrubber and the solution containing an acid such as a weak organic acid at operation 450. The chelating agent is added to the solution in order to prevent metals such as copper from adsorbing to the surface of the substrate. At operation 460, the substrate is advanced to a spin/rinse/dry module. At operation 470, the substrate is dried in less than two minutes at a temperature approximately in the range of 20° C. to 25° C. Other temperatures may be used.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of removing at least one particle from a substrate comprising:

polishing a metallized layer over the substrate using a slurry to remove a portion of the metallized layer;

polishing the substrate using the slurry to remove a portion of a barrier between the metallized layer and the substrate;

introducing deionized water onto the substrate; and introducing a solution comprising a weak acid selected from the group consisting of acetic acid, citric acid, gluconic acid, glucuronic acid, oxalic acid, and tartaric acid.

2. The method of claim 1, wherein the metallized layer is copper.

3. The method of claim 1, wherein the barrier is a metal selected from the group consisting of tantalum, tantalum nitride, titanium, and titanium nitride.

4. The method of claim 1, wherein the solution has a pH that ranges from approximately 3.0 to 5.0.

* * * * *